(12) United States Patent
Kuan

(10) Patent No.: US 7,772,590 B2
(45) Date of Patent: Aug. 10, 2010

(54) METAL COMB STRUCTURES, METHODS FOR THEIR FABRICATION AND FAILURE ANALYSIS

(75) Inventor: Hing Poh Kuan, Singapore (SG)

(73) Assignee: Systems on Silicon Manufacturing Co. Pte. Ltd., Singapore (SG)

( * ) Notice: Subject to any disclaimer, the term of this patent is extended or adjusted under 35 U.S.C. 154(b) by 273 days.

(21) Appl. No.: 11/682,221

(22) Filed: Mar. 5, 2007

(65) Prior Publication Data

US 2008/0218749 A1 Sep. 11, 2008

(51) Int. Cl.
*H01L 23/58* (2006.01)

(52) U.S. Cl. .............. 257/48; 257/E27.048; 361/303; 361/306.1; 324/718; 324/719; 324/763

(58) Field of Classification Search ............ 257/48, 257/734, 665, 184, 457, 307, 532, 534, 920, 257/923, E27.048, E29.343, E23.144, E23.145, 257/E21.014; 333/153, 154, 195; 324/537, 324/538, 718, 719, 763; 361/303, 306.1, 361/306.2, 306.3
See application file for complete search history.

(56) References Cited

U.S. PATENT DOCUMENTS

| 6,690,187 | B2 * | 2/2004 | Song et al. | 324/763 |
| 2007/0241425 | A1 * | 10/2007 | Lin | 257/532 |
| 2009/0230512 | A1 * | 9/2009 | Baek et al. | 257/536 |

* cited by examiner

*Primary Examiner*—Davienne Monbleau
*Assistant Examiner*—Shweta Mulcare
(74) *Attorney, Agent, or Firm*—Harness, Dickey & Pierce, P.L.C.

(57) ABSTRACT

The present disclosure relates to a metal comb structure including a first comb which includes a first set of metal fingers each of the metal fingers being connected at one end thereof by a connecting member from which the metal fingers extend. The metal comb structure also includes a second comb which includes a first set of metal fingers inter-digitated with the metal fingers of the first comb, a first set of vias associated with the metal fingers of the second comb and a connecting member connected to the vias thereby connecting the metal fingers of the second comb. The vias extend from the metal fingers of the second comb such that the connecting member of the second comb is located outside a plane defined by the metal fingers of the first and second combs.

6 Claims, 11 Drawing Sheets

METAL COMB STRUCTURES, METHODS FOR THEIR FABRICATION AND FAILURE ANALYSIS

FIELD

The present disclosure relates to a metal comb structure, for example as used in inter-digitated structures on silicon wafers to capture minute conductive defects that may kill the device or create a short between two separate interconnects. The structure may preferably simplify failure analysis on the captured defects and is particularly useful in wafer fab/clean room studies of defect density and, consequently, may aid in the reduction of defect density.

In particular, the disclosure relates to a metal comb structure including a first comb having metal fingers that are inter-digitated with metal fingers of a second comb, where a connecting member of the second comb which connects the metal fingers of that comb is located outside the plane defined by the metal fingers. Such a structure may preferably enable easy fault isolation within the structure.

BACKGROUND

The statements in this section merely provide background information related to the present disclosure and may not constitute prior art.

Metal comb structures that include an "A" comb inter-digitated with a "B" comb are known. For example, such structures have been widely used in wafer fabrication to capture minute conductive defects that may kill the device or create a short between two separate interconnects of the wafer.

Generally, metal comb structures including an A comb and a B comb are such that each of the A comb and B comb include a number of metal fingers that are inter-digitated. That is, the metal fingers of one plate are interposed between the metal fingers of the other plate. These fingers, sometimes referred to as even metal lines and odd metal lines, are relatively thin and generally quite long. Furthermore, the spacing between the fingers is quite narrow, somewhat dependent on the design requirements in a particular instance.

The high aspect ratio of these structures, dictated by the height of the fingers and the narrow spacing between the fingers, generally results in some disadvantages when it comes to failure analysis de-processing, and particularly when it comes to locating physical defects in the plate comb structures. Insufficient isolation methods inevitably lower failure analysis success rates and lead to increased cycle times.

One method that has been used extensively for failure analysis is the OBIRCH (optical beam induced resistance change) method. This method has been an indispensable failure analysis tool in the semiconductor industry for many years. The method has found use not only for test structures, but also for final products, and is useful for field failures and failures in manufacturing processes at the development phase and mass production phase.

The principle behind the OBIRCH method is relatively simple, generally including heating a structure and detecting resistance change. However, the method has many features and a wide field of application as would be readily appreciated by those of skill in the art.

The sensitivity of defect detection using the OBIRCH method has been improved over the years in various ways. For example, it has been shown that OBIRCH signal is stronger at lower temperatures. The use of a constant current source, rather than a constant voltage source is known to make OBIRCH more sensitive in some applications. It has also been shown that a combination of laser-modulation and lock-in amplifier has made the method more sensitive. Sensitivity may also be improved by using a pre-amplifier.

Derivatives of the OBIRCH method have also been shown to be useful in failure analysis. For example, the Seebeck effect has be shown to work well for detecting voids when no bias is applied to a device. Schottky effect has also been shown to work well for detecting abnormal semiconductor contacts.

Generally, for the detection of failure in a metal comb structure, passive voltage contrast in the scanning electron microscope (SEM) is needed to find the defect more quickly and more accurately than using the OBIRCH method alone.

As the space between metal fingers or lines within metal comb structures decreases, difficulties arise when attempting to detect defects, such as metal stringers, between the fingers or lines. This is generally due to the limited depth of focus of the failure analysis in-line optical analysis tools currently available. Generally, there is a heavy reliance on electrical fault isolation and the accuracy of finding the minute defects using the SEM.

As such, there has been a growing need to develop systems for identification of defects and locating these defects in metal comb structures.

In some instances, a reactive ion etch (RIE) tool has been employed to de-process structures and expose metal lines. Subsequently, the short or defect location has been determined. In that case, oxide particles and TiN shorts may be easily etched away by the RIE tool which generally uses an F-based gas for oxide etching. Indeed, in some instances failure analysis findings have been incorrect due to a misinterpretation of an artifact that was produced during the de-processing process.

The present disclosure aims to provide an alternative metal comb structure that is designed to facilitate easy identification of defects during failure analysis operations.

SUMMARY

According to one aspect of the invention there is provided a metal comb structure including:

a first comb including a first set of metal fingers each of the metal fingers being connected at one end thereof by a connecting member from which the metal fingers extend; and a second comb including a first set of metal fingers inter-digitated with the metal fingers of the first comb, a first set of vias associated with the metal fingers of the second comb and a connecting member connected to the vias thereby connecting the metal fingers of the second comb;

wherein the vias extend from the metal fingers of the second comb such that the connecting member of the second comb is located outside a plane defined by the metal fingers of the first and second combs.

As used herein the term "metal" includes so-called "metalloid" materials, such as silicon, particularly polysilicon.

As will be discussed in more detail hereafter, the provision of the connecting member of the second comb in a position that is located outside the plane in which the metal fingers of the first and second combs extend simplifies subsequent failure analysis determinations. In particular, the connecting member that is located outside from the plane of the metal fingers may be easily lapped off the metal fingers of the second comb leaving the metal fingers of the second comb separate and disconnected from each other and leaving the vias of the second comb exposed. As such, one will be able to easily determine which of the metal fingers of the second comb is shorting to a metal finger of the first comb by PVC (passive voltage contrast) at the exposed via without exposing the metal fingers at the under layer plane during failure analysis. The defect will therefore be more easily detected. This will be described in more detail below.

The position of the vias on the metal fingers of the second comb, and therefore the position of the connecting member of the second comb, is not particularly limited. That is, the vias may be disposed at any point along the length of the metal fingers of the second comb. For example, the vias, and therefore the connecting member of the second comb, may be located on the inner (proximal) or outer (distal) ends of the metal fingers of the second comb. The vias may also be disposed at a mid-point along the length of the metal fingers of the second comb. Generally, the vias, and therefore the connecting member of the second comb, will be disposed on the distal ends of the metal fingers of the second comb.

In the simplest form of the invention, a first comb and a second comb as described above are provided. However, the invention may be equally applicable to metal comb structures that are more complex in their design. For example, repeating units in the form of additional sets of metal fingers may be provided.

According to one exemplary embodiment, the first and second combs are extended to each include first and second sets of parallel metal fingers. More particularly, in this embodiment, the first comb includes an opposing second set of metal fingers connected to and extending from an opposing side of the connecting member of the first comb relative to the first set of metal fingers, and the second comb includes a second set of metal fingers inter-digitated with the second set of metal fingers of the first comb and a second set of vias associated with the second set of metal fingers of the second comb, wherein the connecting member of the second comb is connected to both the first set and second set of vias of the second comb, thereby connecting the first set and second set of metal fingers of the second comb. It will be appreciated by those of skill in the art that in this embodiment, the second set of vias of the second comb must extend from the second set of metal fingers of the second comb in a similar fashion, if not identical fashion, to the first set of vias extending from the first set of metal fingers of the second comb.

According to this embodiment, as a single connecting member is provided to connect the first and second sets of vias of the second comb, it may be preferred that the first and second sets of vias be located at respective ends of the first and second sets of metal fingers of the second comb that are adjacent the connecting member of the first comb. In such an arrangement, the connecting member of the second comb effectively forms a bridge extending over or straddling the connecting member of the first comb. However, the vias of the second comb may be located at any position on the fingers of the second comb.

The second comb may include further additional sets of metal fingers as desired. In such a case, the connecting member of the second comb is connected to vias associated with each of the fingers of each set. As such, in another exemplary embodiment the first comb includes an opposing second set of metal fingers connected to and extending from an opposing side of the connecting member of the first comb relative to the first set of metal fingers, and the second comb includes a plurality of sets of metal fingers inter-digitated with the first and second sets of metal fingers of the first comb, a set of vias associated with each set of metal fingers of the second comb and a connecting member connected to the vias of the second comb thereby connecting the metal fingers of the second comb, wherein the vias of the second comb extend from the metal fingers of the second comb such that the connecting member of the second comb is located outside a plane defined by the metal fingers of the first and second combs.

It will be appreciated that, again, as the sets of metal fingers of the second comb are inter-digitated with the metal fingers of the first comb, the metal fingers of the second comb are in the same plane as the metal fingers of the first comb.

Again, according to this embodiment, the position of the vias of the second comb is not particularly limited.

It will be appreciated that the above description illustrates a progressive extension of the comb structure in the plane of the metal fingers of the first and second combs through the addition of further sets of metal fingers. It will be readily understood that this process of extension and addition may continue as desired and that the disclosure is in no way bound by the arrangements that have been described above. This will be further clarified with reference to the accompanying drawings below.

The materials of construction of the components of the metal comb structure are not particularly limited and are consistent with those known in the art. Furthermore, the method of construction of the comb structure employs techniques that are known in the art. However, the following description is provided as a summary of a method of fabricating the metal comb structure according to the invention, the method defining a further aspect of the invention.

Therefore, according to another aspect of the invention, there is provided a method of fabricating a metal comb structure including:

depositing and patterning a first set of metal fingers and a first connecting member that connects the metal fingers and from which the metal fingers extend;

depositing and patterning a second set of metal fingers inter-digitated with the first set of metal fingers;

depositing a set of vias on the second set of metal fingers; and depositing a second connecting member on the vias that connects the vias, thereby connecting the second set of metal fingers.

It will be appreciated that the structural features described above, and as described in more detail below may be equally applicable to the method above. As such, it should be appreciated that further steps of deposition may be provided in order to form such structures. All such variations are considered to fall within the ambit of the present disclosure.

Furthermore, it will be appreciated that the step of depositing and patterning the first set of metal fingers and first connecting member and that of depositing and patterning the second set of metal fingers will normally be conducted simultaneously.

While the method of deposition and patterning of the first set of metal fingers and first connecting member and the second set of metal fingers is not particularly limited, in an exemplary embodiment the step of depositing and patterning the first set of metal fingers and first connecting member and the step of depositing and patterning the second set of metal fingers includes depositing a thin metal film on the substrate, applying a photoresist layer to the thin metal layer, patterning the photoresist layer using a mask, and dry etching exposed portions of the thin metal layer.

The thin metal layer may be formed from any suitable material as would be appreciated by those of skill in the art. This may include metals such as aluminium and copper, or metalloids such as polysilicon. Preferably, the thin metal layer is formed from aluminium or polysilicon. Likewise, the metal layer may be deposited by any suitable means, for example chemical vapor deposition or physical vapor deposition. Generally, physical vapor deposition will be employed for this purpose.

When the first set of metal fingers and first connecting member and the second set of metal fingers have been deposited and patterned on the substrate, the vias will be deposited on the second set of metal fingers. Generally, the step of depositing the vias may preferably include depositing a layer of silicon oxide on the deposited and patterned first set of metal fingers and first connecting member and the second set of metal fingers, dry etching holes in the silicon oxide layer that extend to the deposited and patterned second set of metal fingers, and depositing a metal layer on the silicon oxide layer and in the etched holes of the silicon oxide layer.

In order to prevent shorting between the vias, it may be preferred that following deposition of the metal layer on the silicon oxide layer and in the etched holes of the silicon oxide layer, the deposited metal layer is chemical-mechanically polished to isolate the vias and leave the vias exposed.

The material forming the vias is not particularly limited and may include those materials commonly used in the art. Generally, the metal layer deposited onto the silicon oxide layer and in the etched holes, corresponding to the vias, is tungsten.

As noted above, once the deposited metal layer is chemical-mechanically polished, the vias are generally isolated from one another. Preferably, following isolation of the vias a thin metal layer may be deposited on the exposed vias to form the second connecting member. The thin metal layer is generally deposited on the exposed vias by physical vapour deposition, although other methods may be employed. Preferably, the thin metal layer, and therefore the second connecting member, may be formed from aluminium.

As previously noted, the metal comb structures of the invention provide substantial advantages when failure analysis procedures are required. Therefore, according to yet another aspect of the invention there is provided a failure analysis procedure for determining a fault in a metal comb structure, the procedure including:

providing a metal comb structure according to the invention and as described above, located on a substrate;

identifying that the structure includes a fault;

removing the connecting member of the second comb thereby leaving the vias of the second comb exposed;

connecting or electrically grounding the metal fingers of the first comb to the substrate on which the metal comb structure is located; and imaging the exposed vias.

Removal of the connecting member of the second comb may be achieved by any suitable means. In an exemplary embodiment, removal of the connecting member of the second comb includes lapping off the connecting member.

Likewise, connection or electrical grounding of the metal fingers of the first comb is not limited to any particular procedure. Preferably, the connecting or electrical grounding of the metal fingers of the first comb may include application of a laser beam or focused ion beam.

Furthermore, imaging of the exposed vias may be achieved by any suitable process. Generally, imaging of the exposed vias includes passive voltage contrast using a low voltage beam in a SEM.

These features of the failure analysis procedure will be dealt with in more detail below.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

A more detailed description of exemplary embodiments will now be provided with reference to the accompanying drawing. It is to be understood that the detailed description is provided for exemplification only and that this should not be construed as limiting on the invention in any way.

Figure 2:
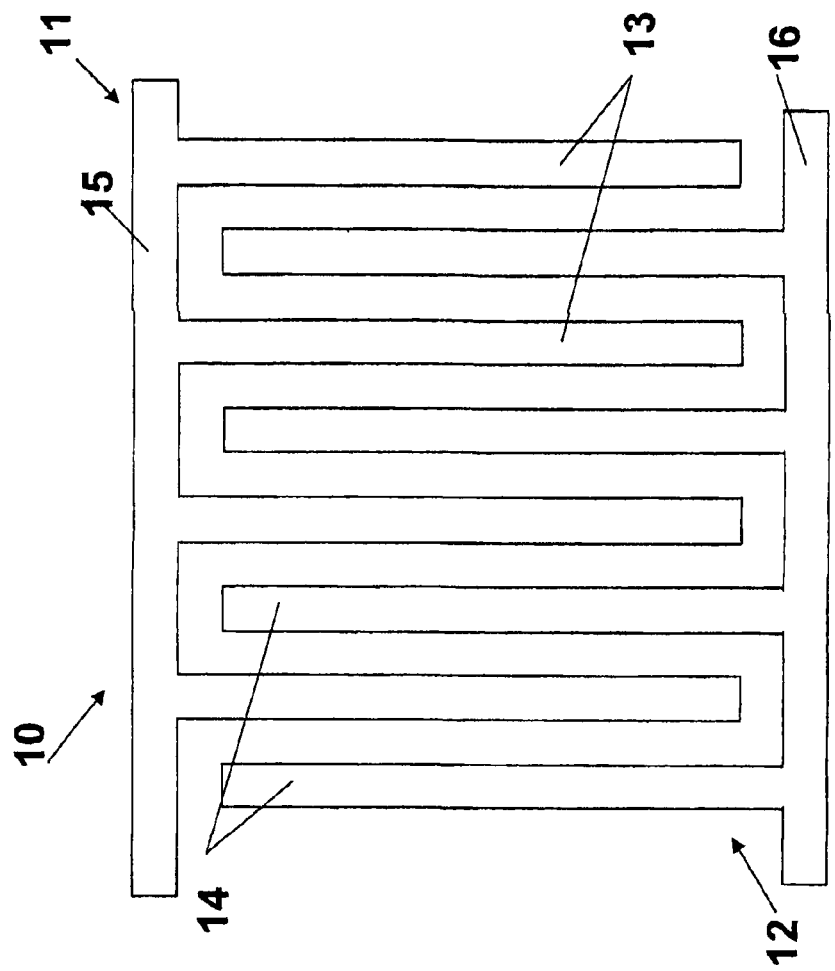
FIG. 2 illustrates a plan view of the two plate comb structure of FIG. 1.
Figure 1:
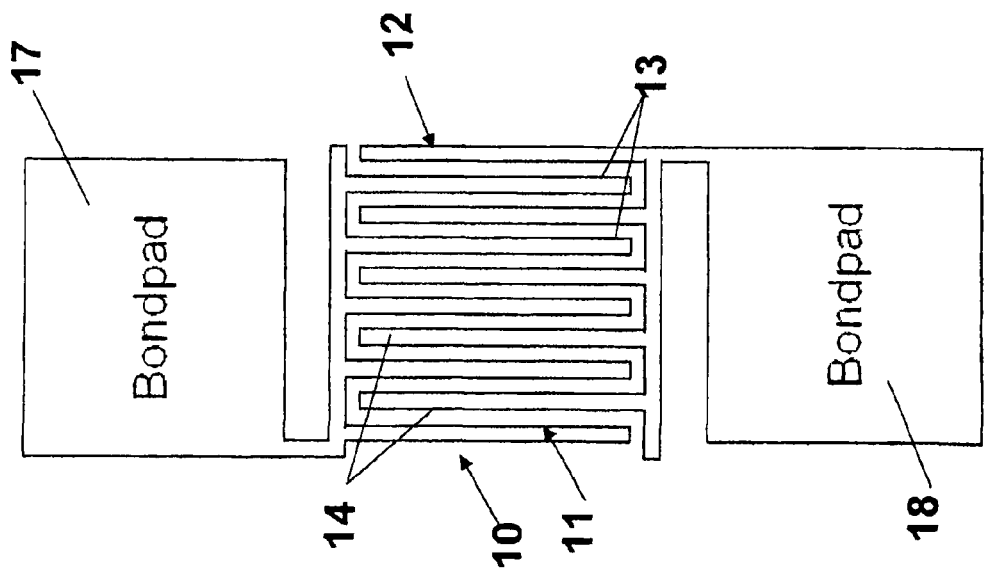
FIG. 1 illustrates a plan view of a conventional two plate comb structure attached to bond pads.
Figure 3:
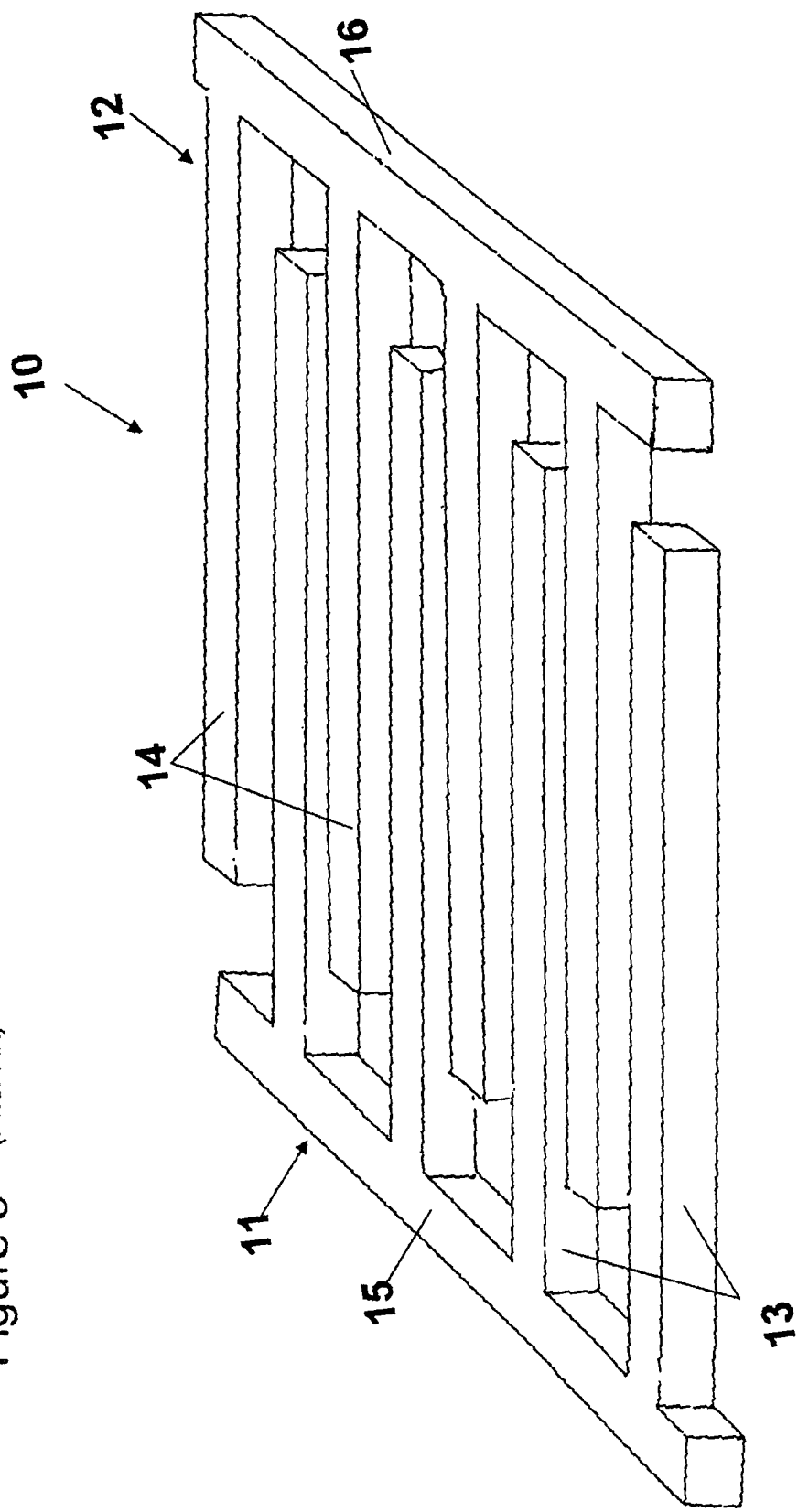
FIG. 3 illustrates a perspective view of the two plate comb structure of FIG. 1.

Referring to FIGS. 1 to 3, conventional two plate comb structures 10 include a first comb 11 and a second comb 12. The first comb 11 and second comb 12 include a set of metal fingers, 13 and 14 respectively. The metal fingers 13 and 14 are parallel and elongate and extend from connecting members 15 and 16. Generally, such structures 10 are attached to a pair of bond pads 17 and 18 as illustrated in FIG. 1.

As previously noted, due to the height of the fingers 13 and 14 and the very narrow spacing between the fingers 13 of the first comb 11 and the fingers 14 of the second comb, these structures have a very high aspect ratio. This generally results in some disadvantages when it comes to failure analysis de-processing. More particularly, the high aspect ratio of these structures can cause substantial difficulties when it comes to locating physical defects in the plate comb structures 10. As mentioned above, insufficient isolation methods inevitably lower failure analysis success rates and lead to increased cycle times.

Generally, as will be appreciated by those of skill in the art and as already discussed above, as the space between metal fingers 13 and 14 within metal comb structure 10 decreases, difficulties arise when attempting to detect defects, such as metal stringers, between the fingers 13 and 14. This is generally due to the limited depth of focus of the failure analysis in-line optical analysis tools currently available. Generally, there is a heavy reliance on electrical fault isolation and the accuracy of finding the minute defects using the SEM.

A reactive ion etch (RIE) tool has been employed in the past to de-process comb structures 10 and expose the metal finger 13 and 14. Subsequently, the short or defect location may be determined. However, as previously noted, oxide particles and TiN shorts may be easily etched away by the RIE tool which generally uses an F-based gas for oxide etching.

Figure 4:
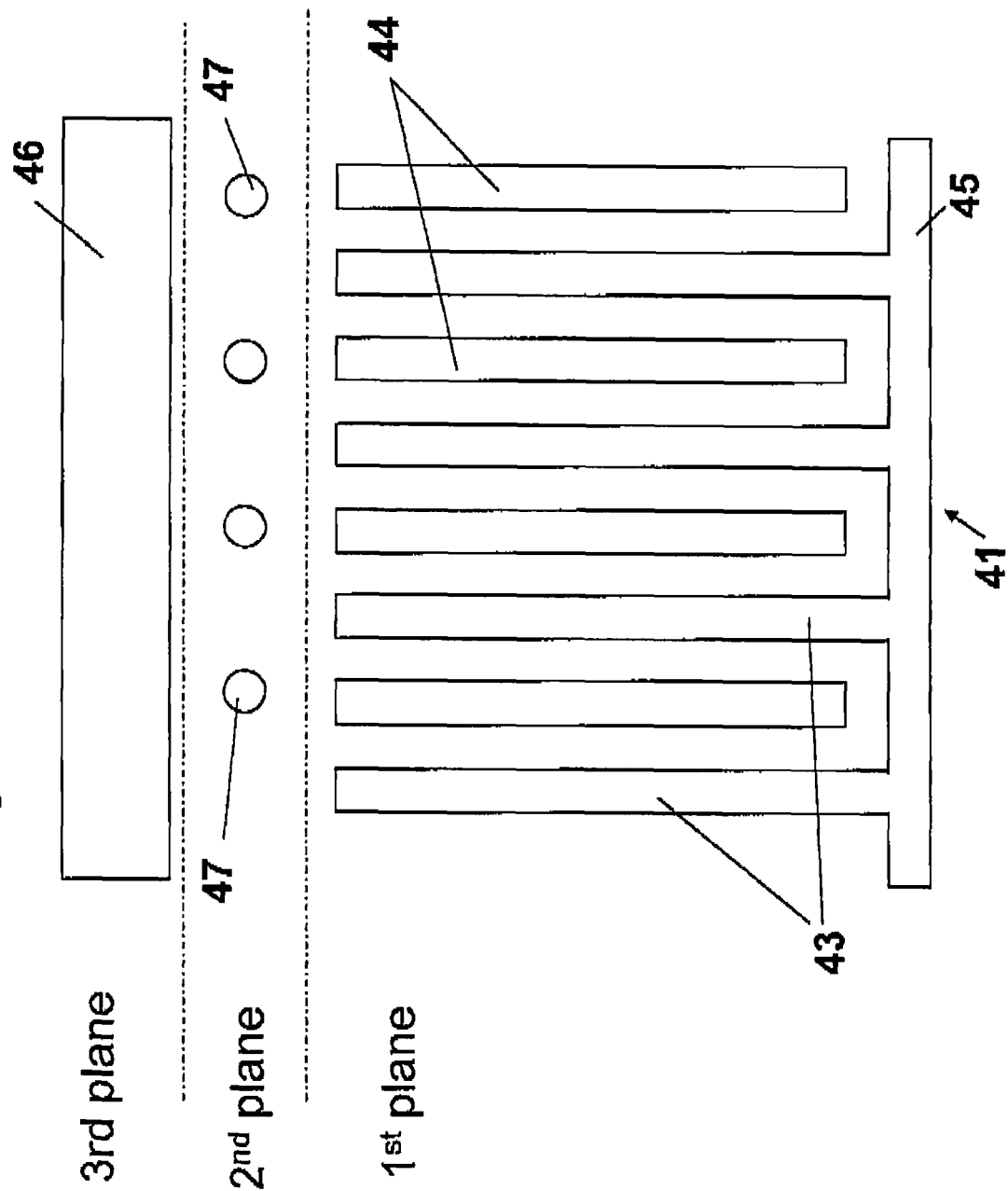
FIG. 4 illustrates an exploded plan view of a metal comb structure according to one embodiment of the invention.
Figure 5:
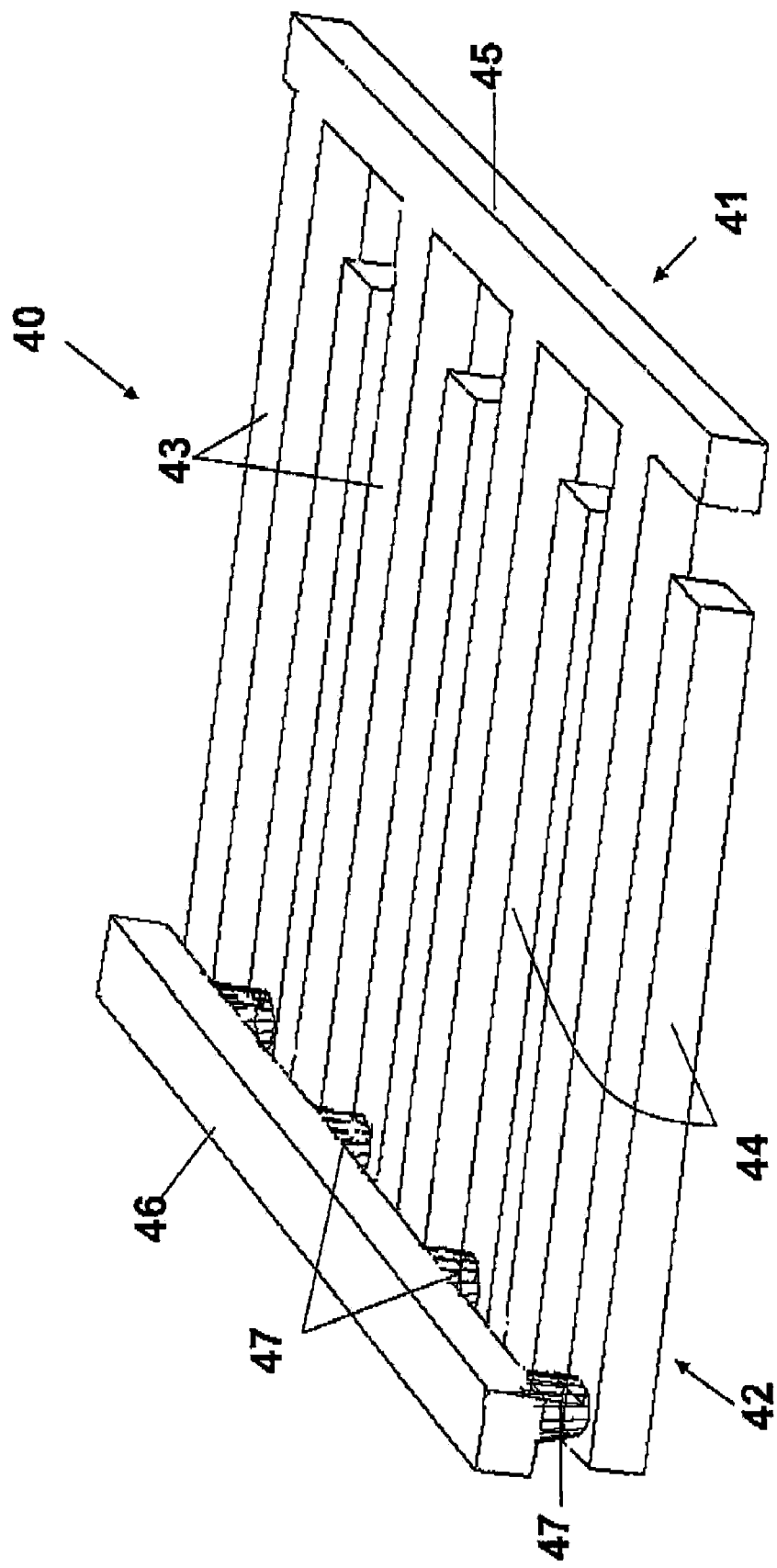
FIG. 5 illustrates a perspective view of the metal comb structure of FIG. 4.
Figure 6:
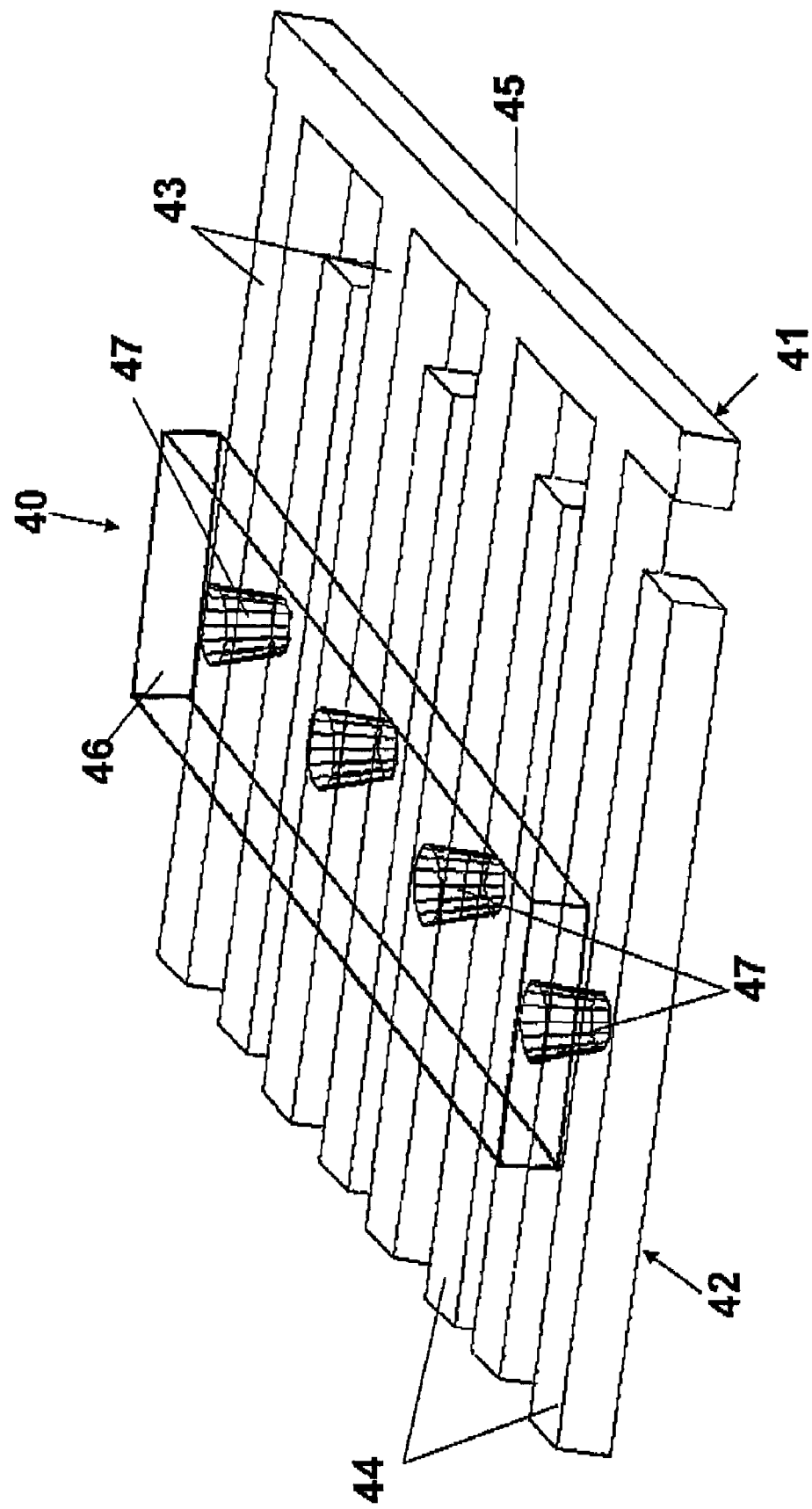
FIG. 6 illustrates an alternative embodiment of a metal comb structure according to the invention.

Turning to FIGS. 4 to 6, the metal comb structure 40 of the invention, in its simplest form, includes a first comb 41 and a second comb 42. The first comb 41 is substantially flat and includes a set of metal fingers 43 that extend in a two dimensional plane and a connecting member 45 located at one end of the metal fingers 43 that connects the metal fingers 43. The connecting member 45 is in the plane defined by the metal fingers 43.

The second comb 42 of the comb structure 40 includes a set of metal fingers 44 that inter-digitated, or interposed between, the metal fingers 43 of the first comb 41, as was the case with conventional comb structures. However, the comb structure 40 disclosed differs from conventional comb structures, as illustrated for example in FIGS. 1 to 3, in that a second comb 42 includes a set of vias 47, each of which is associated with a respective metal finger 44 of the second comb 42. The vias 47 extend perpendicularly from the metal fingers 42 such that a connecting member 46 of the second comb 42 is located outside the plane defined by the metal fingers 43 and 44. It has been found that such a construction provides substantial advantages when it comes to failure analysis of the structure 40, as will be described in more detail below.

The position of the vias 47 on the metal fingers 44 of the second comb 42 is not particularly limited and may be decided depending on the particular use intended for the structure 40. As illustrated in FIG. 5, the vias 47, and therefore the connecting member 46 of the second comb 42, may be located at the ends of the metal fingers 44. This arrangement places the connecting member 46 of the second comb 42 remote from the connecting member 45 of the first comb 41. Alternatively, as illustrated in FIG. 6, the vias 47 and the connecting member 46 of the second comb 42 may be positioned at a midpoint, or indeed at any point, on the metal fingers 44.

As will be appreciated from the above discussion of the conventional comb structures 10 as illustrated in FIGS. 1 to 3, the comb structures 40 illustrated in FIGS. 4 to 6 may be considered two plate comb structures given that they include only a first comb 41 and a second comb 42.

Figure 7:
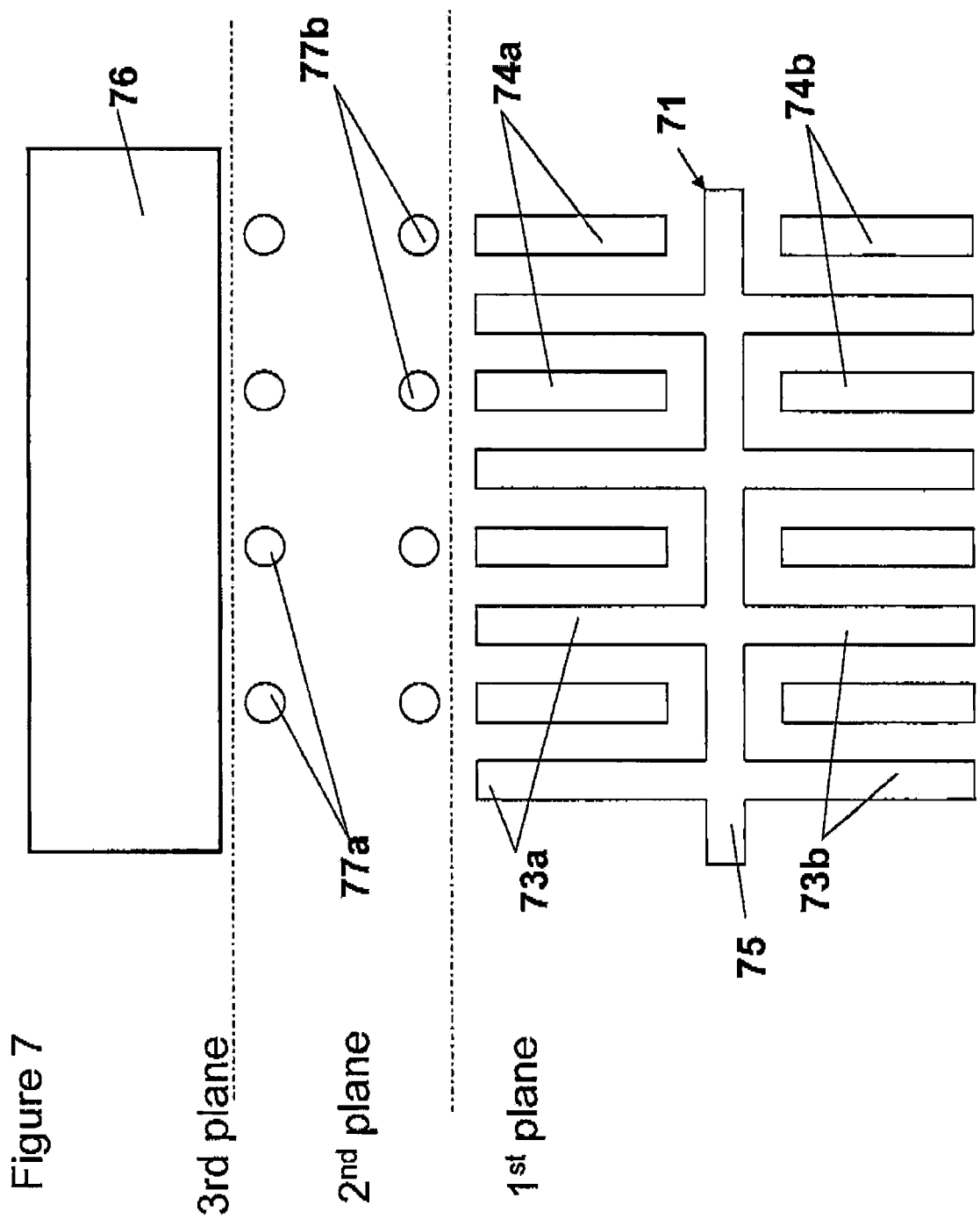
FIG. 7 illustrates an exploded plan view of a further embodiment of a metal comb structure according to the invention.
Figure 8:
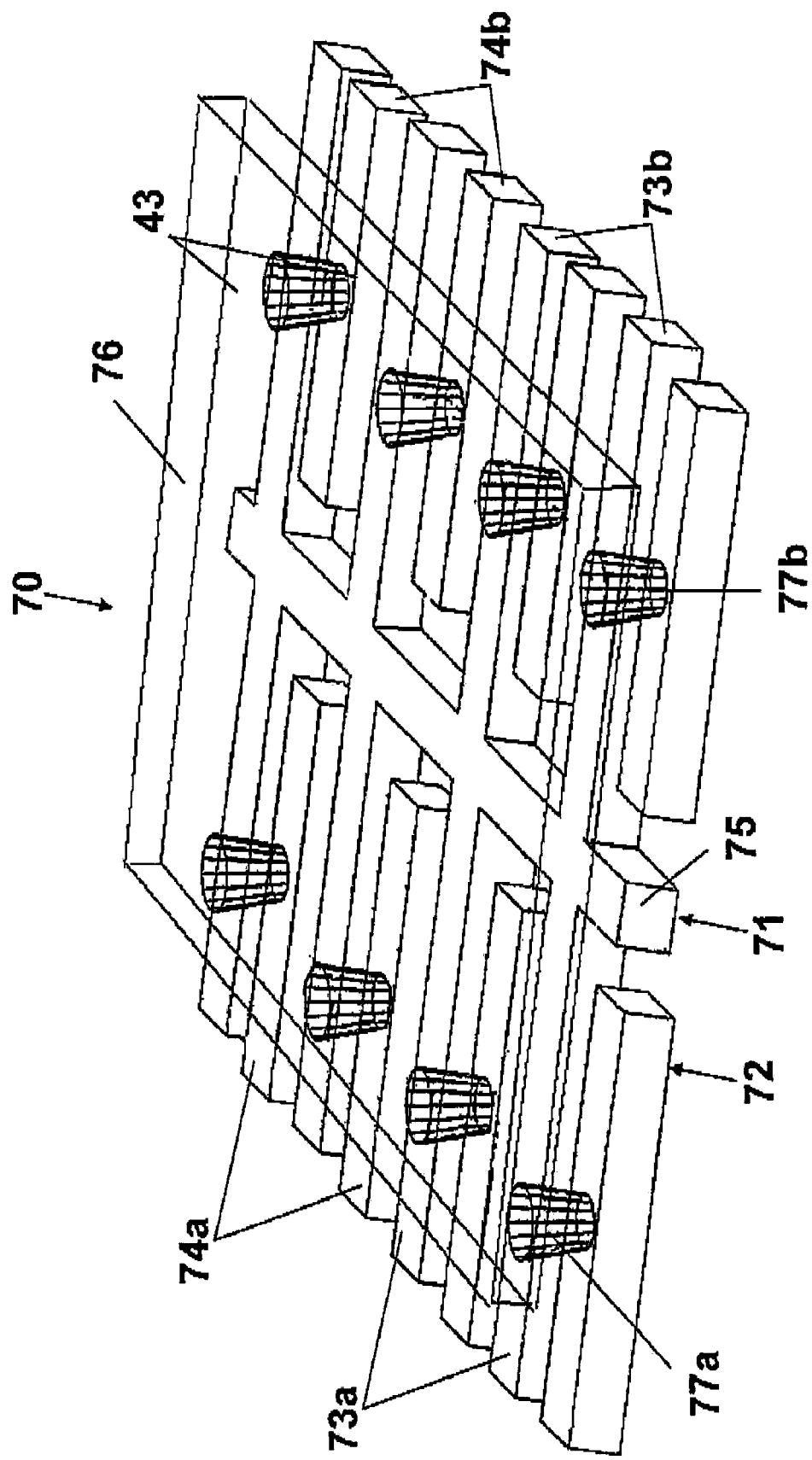
FIG. 8 illustrates a perspective view of the metal comb structure of FIG. 7.

FIGS. 7 and 8 illustrate an alternative form of comb structure 70 that is considered to fall within the ambit of the invention. The comb structure 70 includes a first comb 71 and a second comb 72. Each of these combs 71 and 72 includes two sets of metal fingers. In particular, the first comb 71 includes a first set of metal fingers 73a and a second set of metal fingers 73b, while the second comb 72 includes a first set of metal fingers 74a and a second set of metal fingers 74b. As will be appreciated from the Figures, the metal fingers 73a of the first comb 71 are inter-digitated or disposed between the metal fingers 74a of the second comb 72. Likewise, the metal fingers 73b of the first comb 71 are inter-digitated or disposed between the metal fingers 74b of the second comb 72.

The first set of metal fingers 73a of the first comb 71 are connected by a connecting member 75 which is also common with and connects the second set of metal fingers 73b of the first comb 71. The first and second sets of metal fingers 73a and 73b extend from opposite sides of the connecting member 75. In a very similar fashion, the first set of metal fingers 74a of the second comb 72 are connected by a connecting member 76 which is also common with and connects the second set of metal fingers 74b of the second comb 72. The first and second sets of metal fingers 74a and 74b also extend from opposite sides of the connecting member 76 so that they inter-digitate with the metal fingers 73a and 73b of the first comb 71.

In the embodiment illustrated in FIGS. 7 and 8, in order to separate the connecting member 76 of the second comb 72 from the plane defined by the fingers 73a, 73b of the first comb 71 and 74a, 74b of the second comb 72, two sets of vias 77a and 77b are provided which are associated with the first set of metal fingers 74a and the second set of metal fingers 74b of the second comb 72 respectively.

The vias 77a and 77b extend perpendicularly from the metal fingers 74a and 74b thereby removing the connecting member 76 from the plane defined by the metal fingers 73a, 73b, 74a and 74b of the structure 70. In that regard, the connecting member 76 of the second comb 72 is connected to both sets of vias 77a and 77b.

Figure 9:
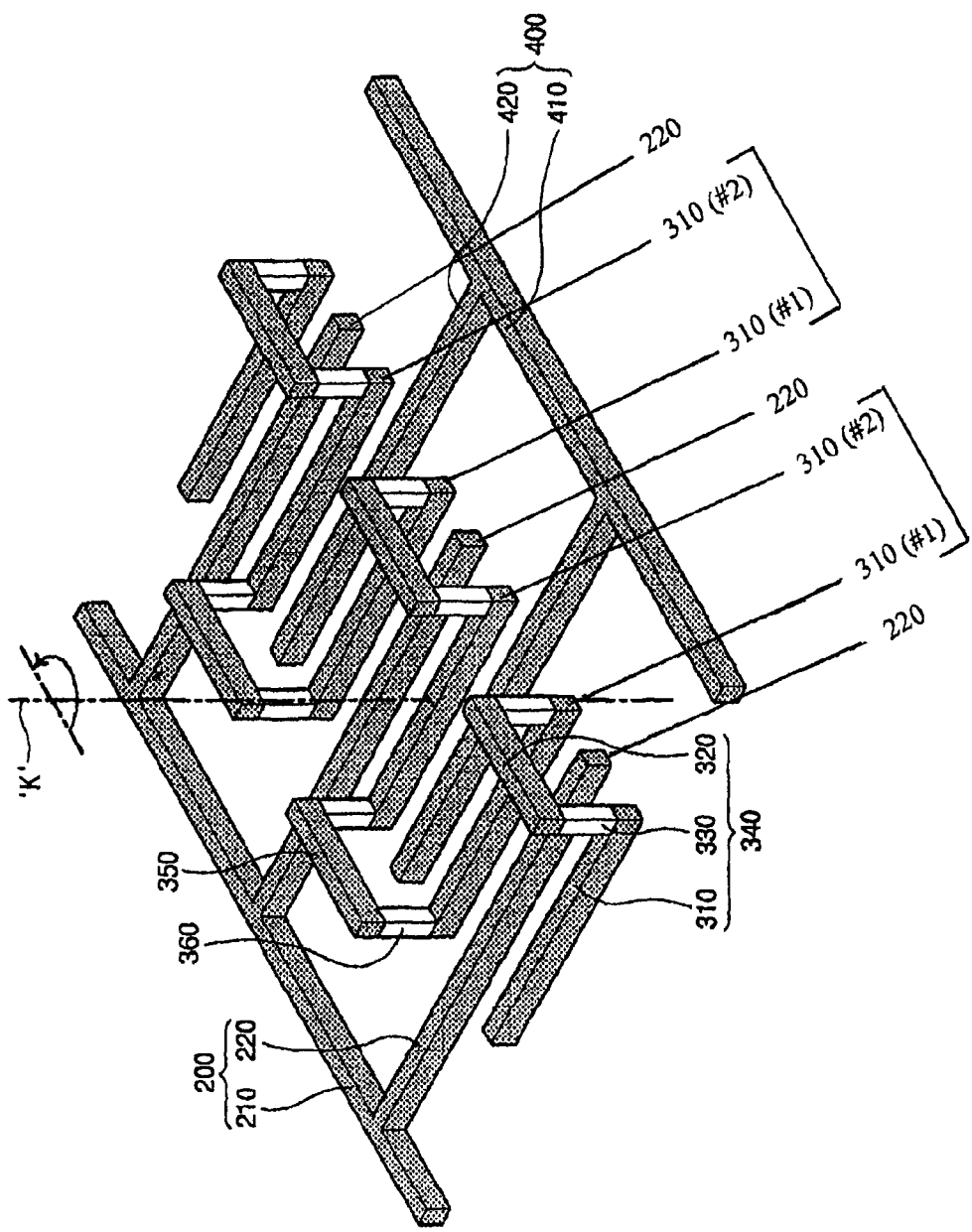
FIG. 9 illustrates a perspective view of the metal comb structure of FIG. 5 undergoing failure analysis.

FIG. 9 illustrates a comb structure 90 that is the same as that illustrated in FIG. 5 with the connecting member (not shown) of the second comb 92 lapped off. This best illustrates the comb structures of the invention in use in failure analysis.

Referring to FIG. 9, the first comb 91, including metal fingers 93 and connecting member 95 remain intact. However, the connecting member of the second comb 92 has been lapped off to leave the vias 97 exposed. As a result, the metal fingers 94 of the second comb 92 are isolated from one another.

If a fault 98, for example a stringer, is present resulting in a short between a metal finger 93a of the first comb 91 and a metal finger 94a of the second comb 92, the respective via 97a located on the metal finger 94a of the second comb 92 will be easily detected. This may be achieved by connecting or electrically grounding the metal fingers 93 of the first comb 91 to the silicon substrate. As a result of grounding the metal fingers 93 of the first comb 91, the via 97a will light up in comparison to the other vias 97. The via 97a may then be detected by imaging using a low voltage (kV) beam SEM.

Figure 10:
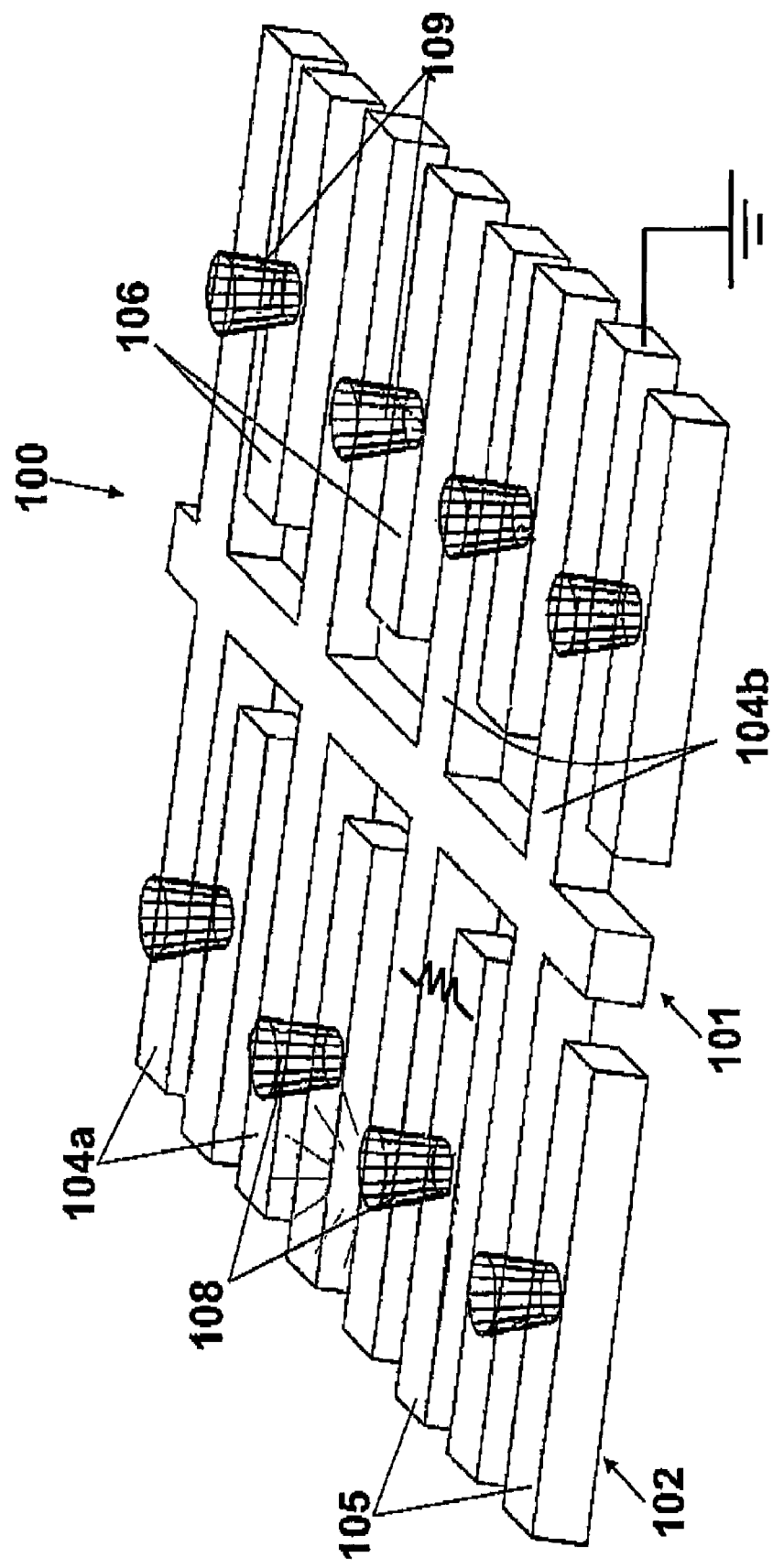
FIG. 10 illustrates a perspective view of the metal comb structure of FIG. 8 undergoing failure analysis.

FIG. 10 illustrates a metal comb structure 100 that is quite similar to that illustrated in FIG. 8. In this case the metal fingers 104a and 104b of the first comb 101 are inter-digitated, or interposed between, the metal fingers 105 and 106 of a second comb 102 respectively. The connecting member (not shown) of the second comb 102 is connected to vias 108 and 109 that are located at any point on the metal fingers 105 and 106 respectively of the second comb 102.

In a similar fashion to that illustrated in FIG. 9, grounding of the metal fingers 104 of the first comb 101 will result in illumination of the metal finger of the second comb 102 that is shorting to a metal finger 104 of the first comb 101.

Figure 11:
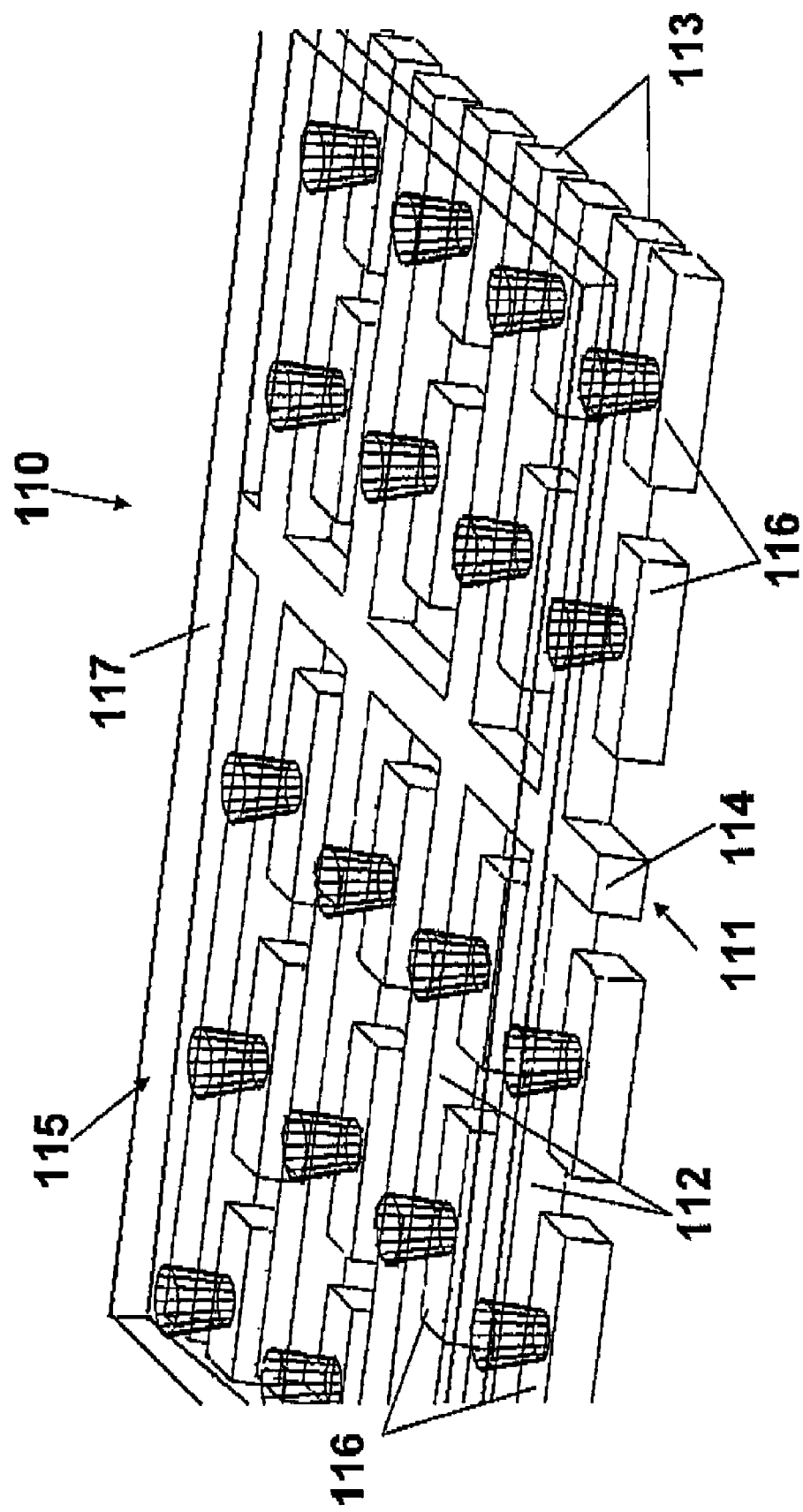
FIG. 11 illustrates a perspective view of still another embodiment of a metal comb structure according to the invention.
Figure 12:
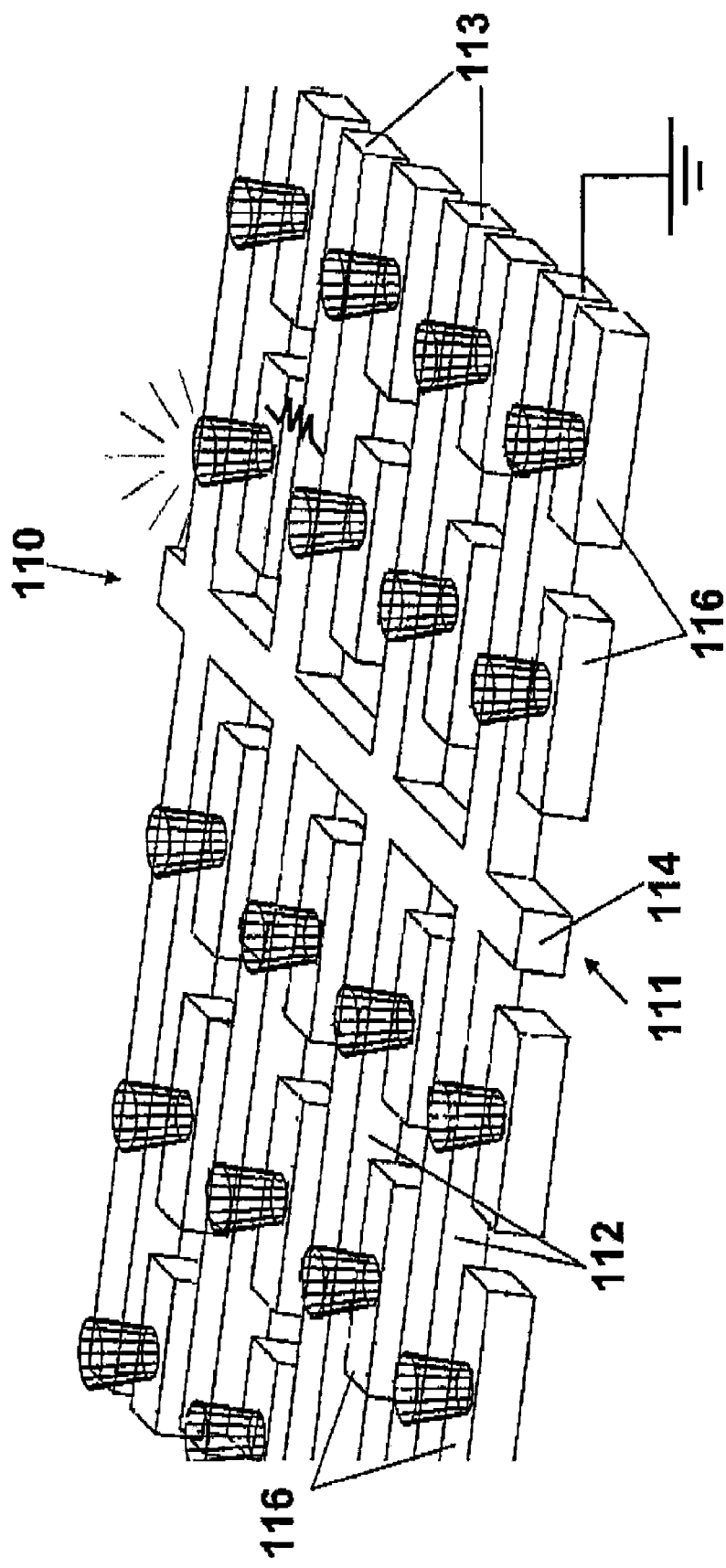
FIG. 12 illustrates a perspective view of the metal comb of FIG. 11 undergoing failure analysis.

It will be appreciated by those of skill in the art that more complex structures may also fall within the ambit of the invention while still providing the advantages of the invention. Turning to FIG. 11, a more complex comb structure 110 is illustrated that includes first comb 111 that has two sets of metal fingers 112 and 113 extending from either side of a connecting member 114. A second comb 115 including a plurality of sets of short or discontinuous metal fingers 116 and a connecting member 117 is also provided. During failure analysis, once again the connecting member 117 of the second comb 115 may be lapped off to provide for easier isolation of any failure (refer to FIG. 12).

It will of course be realized that the above has been given only by way of illustrative example of the invention and that all such modifications and variations thereto as would be apparent to persons of skill in the art are deemed to fall within the broad scope and ambit of the invention as herein set forth.

When introducing elements or features and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A metal comb structure comprising, in combination:
    a first comb including a first set of metal fingers, each of the metal fingers being connected at one end thereof by a connecting member from which the metal fingers extend, wherein the metal fingers of the first comb are not coaxial with one another; and
    a second comb including a first set of metal fingers inter-digitated and co-planar with the metal fingers of the first comb, with no more than one metal finger of the second comb inter-digitated between any two adjacent metal fingers of the first comb, a first set of vias associated with the metal fingers of the second comb and a connecting member connected to the vias thereby connecting the metal fingers of the second comb;
    wherein the vias extend from the metal fingers of the second comb such that the connecting member of the second comb is located outside a plane defined by the metal fingers of the first and second combs.

2. A metal comb structure according to claim 1, wherein the connecting member connecting the vias is a single connecting member which connects all of the set of vias together.

3. A metal comb structure according to claim 1, wherein the vias are located at mid-points along the length of the metal fingers of the second comb.

4. A metal comb structure according to claim 1, wherein the first comb includes an opposing second set of metal fingers connected to and extending from an opposing side of the connecting member of the first comb relative to the first set of metal fingers, and the second comb includes a second set of metal fingers inter-digitated with the second set of metal fingers of the first comb and a second set of vias associated with the second set of metal fingers of the second comb, wherein the connecting member of the second comb is connected to both the first set and second set of vias of the second comb, thereby connecting the first set and second set of metal fingers of the second comb.

5. A metal comb structure according to claim 4, wherein the first and second sets of vias are located at respective ends of the first and second sets of metal fingers of the second comb that are adjacent the connecting member of the first comb.

6. A metal comb structure according to claim 1, wherein the first comb includes an opposing second set of metal fingers connected to and extending from an opposing side of the connecting member of the first comb relative to the first set of metal fingers, and the second comb includes a plurality of sets of metal fingers inter-digitated with the first and second sets of metal fingers of the first comb, a set of vias associated with each set of metal fingers of the second comb and a connecting member connected to the vias of the second comb thereby connecting the metal fingers of the second comb, wherein the vias of the second comb extend from the metal fingers of the second comb such that the connecting member of the second comb is located outside a plane defined by the metal fingers of the first and second combs.

* * * * *